US012648321B2

(12) United States Patent
Kim

(10) Patent No.: US 12,648,321 B2
(45) Date of Patent: Jun. 2, 2026

(54) DISPLAY DEVICE WITH COLOR FILTER OVER NONEMITTING REFLECTIVE AREA

(71) Applicant: LG Display Co., Ltd., Seoul (KR)

(72) Inventor: KaKyung Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 876 days.

(21) Appl. No.: 17/892,705

(22) Filed: Aug. 22, 2022

(65) Prior Publication Data

US 2023/0232688 A1 Jul. 20, 2023

(30) Foreign Application Priority Data

Dec. 30, 2021 (KR) ........................ 10-2021-0193528

(51) Int. Cl.
| | |
|---|---|
| *H01L 27/32* | (2006.01) |
| *H01L 51/52* | (2006.01) |
| *H10K 59/35* | (2023.01) |
| *H10K 59/80* | (2023.01) |
| *H10K 59/122* | (2023.01) |

(52) U.S. Cl.
CPC ....... H10K 59/352 (2023.02); H10K 59/8792 (2023.02); H10K 59/122 (2023.02)

(58) Field of Classification Search
CPC ................................................... H10K 59/352
See application file for complete search history.

(56) References Cited

U.S. PATENT DOCUMENTS

| | | | |
|---|---|---|---|
| 2011/0043096 A1 | 2/2011 | Asaki | |
| 2018/0197922 A1* | 7/2018 | Song .................. | H10K 59/8792 |
| 2021/0005845 A1 | 1/2021 | Kim et al. | |
| 2021/0202585 A1* | 7/2021 | Chen .................... | H10K 59/878 |
| 2021/0264823 A1* | 8/2021 | Heo ........................ | G06F 3/044 |

FOREIGN PATENT DOCUMENTS

| | | | | | |
|---|---|---|---|---|---|
| CN | 111554728 A | * | 8/2020 | ............. | H10K 50/85 |
| CN | 114512529 A | * | 5/2022 | ............. | H10K 59/12 |
| KR | 10-2009-0065104 A | | 6/2009 | | |
| KR | 10-2015-0125197 A | | 11/2015 | | |
| KR | 10-2017-0044078 A | | 4/2017 | | |
| KR | 10-2021-0004006 A | | 1/2021 | | |

OTHER PUBLICATIONS

Korean Intellectual Property Office, Office Action, Korean Patent Application No. 10-2021-0193528, Nov. 8, 2025, 15 pages.

* cited by examiner

*Primary Examiner* — Peter Bradford
(74) *Attorney, Agent, or Firm* — Fenwick & West LLP

(57) ABSTRACT

Embodiments of the present disclosure relate to a display device, and more particularly, to a display device where a difference between an area of a first opening and an area of the first emission region in the display device is greater than a difference between an area of a second opening and an area of the second emission region in the display device. As a result, reflected light is not excessively biased toward any one color on color coordinates.

12 Claims, 12 Drawing Sheets

| | BM |
| --- | --- |
| | EA1 |
| | EA2 |
| | EA3 |
| | PE1, PE2, PE3 |

*PRIOR ART*

*PRIOR ART*

PRIOR ART

DISPLAY DEVICE WITH COLOR FILTER OVER NONEMITTING REFLECTIVE AREA

CROSS REFERENCE TO RELATED APPLICATION

This application claims priority from Republic of Korea Patent Application No. 10-2021-0193528, filed on Dec. 30, 2021, which is hereby incorporated by reference in its entirety.

BACKGROUND

Technical Field

The present disclosure relates to a display device.

Description of the Related Art

A display device is required to lower the reflectance of the external light in order to allow the user to easily identify the displayed information even in the presence of external light.

A display device may include a plurality of pixels including a light emitting element and various circuit elements for driving the light emitting element. However, when external light is reflected by various material layers constituting the light emitting device and the circuit device, it is difficult for a user using the display device to identify information displayed on the display device.

Conventional display devices use a polarizing plate to suppress reflection of external light. When a polarizing plate was used, the reflectance of external light could be effectively lowered. However, since the polarizing plate is expensive, the manufacturing cost of the display device is increased. In addition, it is difficult to reduce the thickness of the display device, and there is a problem in that the light emitted from the light emitting device passes through the polarizing plate and the brightness decreases.

SUMMARY

In the field of display technology, technology for realizing a low reflectance without using a polarizing plate that is expensive and significantly reduces the brightness of a display device is being studied. However, when a polarizing plate is not used, there is a problem in that the reflected light is excessively biased toward a specific color on the color coordinates. Accordingly, a display device capable of improving the brightness of a display device without using a polarizing plate, and in which reflected light is not greatly biased on color coordinates is disclosed.

In one embodiment, a display device comprises: a first sub-pixel comprising a first light emitting area configured to emit light of a first color; a second sub-pixel comprising a second light emitting area configured to emit light of a second color that is different from the first color; a color filter comprising a first color filter pattern and a second color filter pattern, the first color filter pattern overlapping the first light emitting area, and the second color filter pattern overlapping the second light emitting area; and a black matrix comprising a first opening and a second opening, the first opening overlapping the first light emitting area of the first sub-pixel, and the second opening overlapping the second light emitting area of the second sub-pixel, wherein a difference between an area of the first opening and an area of the first light emitting area is greater than a difference between an area of the second opening and an area of the second light emitting area.

In one embodiment, a display device comprises: a first sub-pixel comprising a first light emitting area configured to emit light of a first color and a first non-light emitting area that does not emit light; a color filter comprising a first color filter pattern that overlaps both the first light emitting area and the first non-light emitting area of the first sub-pixel; and a black matrix comprising a first opening and a second opening that is smaller than the first opening, the first opening overlapping the first light emitting area, and the second opening overlapping the first non-light emitting area.

DETAILED DESCRIPTION

Figure 1:
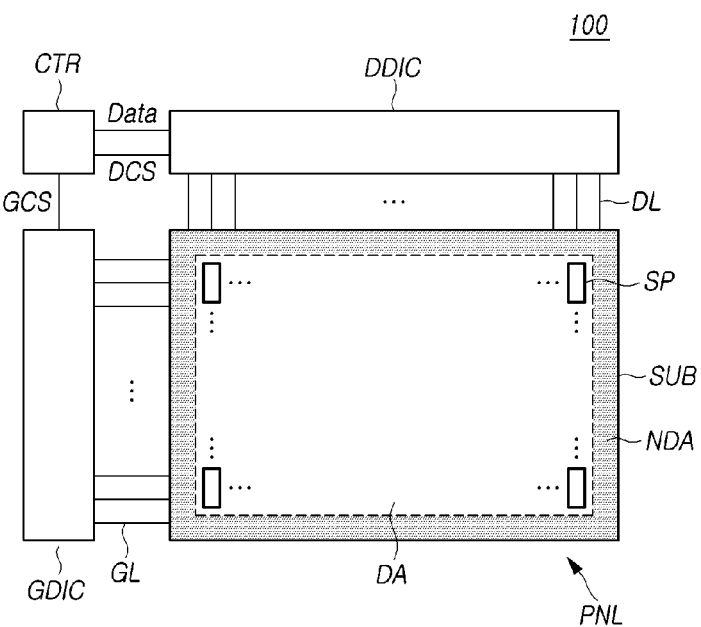
FIG. 1 illustrates a schematic system configuration diagram of the electronic device according to an embodiment of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the accompanying drawings.

FIG. 1 is a system configuration diagram of a display device 100 according to embodiments of the present disclosure.

Referring to FIG. 1, a display device 100 according to embodiments of the present disclosure may include a display panel PNL and a driving circuit for driving the display panel PNL.

The driving circuit may include a data driving circuit DDIC and agate driving circuit GDIC, and may further include a controller CTR controlling the data driving circuit DDIC and the gate driving circuit GDIC.

The display panel PNL may include a substrate SUB and signal lines such as a plurality of data lines DL and a plurality of gate lines GL disposed on the substrate SUB. The display panel PNL may include a plurality of sub-pixels SP connected to a plurality of data lines DL and a plurality of gate lines GL.

The display panel PNL may include a display area DA in which an image is displayed and a non-display area NDA in which an image is not displayed. In the display panel PNL, a plurality of sub-pixels SP for displaying an image are disposed in the display area DA. In the non-display area NDA, the driving circuits DDIC, GDIC, and CTR may be electrically connected or the driving circuits DDIC, GDIC, and CTR may be mounted, and a pad portion to which an integrated circuit or a printed circuit is connected may be placed.

The data driving circuit DDIC is a circuit for driving the plurality of data lines DL, and may supply data signals to the plurality of data lines DL. The gate driving circuit GDIC is a circuit for driving the plurality of gate lines GL, and may supply gate signals to the plurality of gate lines GL. The controller CTR may supply the data control signal DCS to the data driving circuit DDIC to control the operation timing of the data driving circuit DDIC. The controller CTR may supply the gate control signal GCS for controlling the operation timing of the gate driving circuit GDIC to the gate driving circuit GDIC.

The controller CTR starts scanning according to the timing implemented in each frame. The controller CTR converts the input image data input from the outside according to the data signal format used by the data driving circuit DDIC. The controller CTR supplies the converted image data to the data driving circuit DDIC. The controller CTR may control the data drive at an appropriate time according to the scan.

The controller CTR may output various gate control signals GCS including a gate start pulse GSP, a gate shift clock GSC, a gate output enable signal GOE, etc. to control the gate driving circuit GDIC.

The controller CTR may output various data control signals DCS including source start pulse SSP, source sampling clock SSC, source output enable signal SOE, etc. to control the data driving circuit DDIC.

The controller CTR may be implemented as a separate component from the data driving circuit DDIC, or may be integrated with the data driving circuit DDIC to be implemented as an integrated circuit.

The data driving circuit DDIC receives image data from the controller CTR and supplies data voltages to the plurality of data lines DL to drive the plurality of data lines DL. Hereafter, the data driving circuit DDIC is also referred to as a source driving circuit.

The data driving circuit DDIC may include one or more source driver integrated circuits (SDICs).

For example, each source driver integrated circuit SDIC may be connected to the display panel PNL by a tape automated bonding (TAB) method, or may be connected to a bonding pad of the display panel PNL by a chip on glass (COG) method or chip on panel (COP) method, or may be implemented in a chip on film (COF) method and connected to the display panel PNL.

The gate driving circuit GDIC may output a gate signal of a turn-on level voltage or a gate signal of a turn-off level voltage according to the control of the controller CTR. The gate driving circuit GDIC may sequentially drive the plurality of gate lines GL by sequentially supplying a gate signal of a turn-on level voltage to the plurality of gate lines GL.

The gate driving circuit GDIC may be connected to the display panel (PNL) by a tape automated bonding (TAB) method, or may be connected to a bonding pad of the display panel PNL by a chip on glass (COG) method or chip on panel (COP) method, or may be implemented in a chip on film (COF) method and connected to the display panel PNL. Alternatively, the gate driving circuit GDIC may be formed in the non-display area NDA of the display panel PNL in a gate in panel (GIP) type. The gate driving circuit GDIC may be disposed on or connected to the substrate SUB. That is, in the case of the GIP type, the gate driving circuit GDIC may be disposed in the non-display area NDA of the substrate SUB. The gate driving circuit GDIC may be connected to the substrate SUB in the case of a chip on glass (COG) type, a chip on film (COF) type, or the like.

Meanwhile, at least one of the data driving circuit DDIC and the gate driving circuit GDIC may be disposed in the display area DA. For example, a driving circuit of at least one of the data driving circuit DDIC and the gate driving circuit GDIC may be disposed not to overlap the sub-pixels SP, and some or all of them may be disposed to overlap the sub-pixels SP.

The data driving circuit DDIC may convert the image data received from the controller CTR into an analog data voltage and supply it to the plurality of data lines DL when a specific gate line GL is opened by the gate driving circuit GDIC.

The data driving circuit DDIC may be connected to one side (e.g., an upper side or a lower side) of the display panel PNL. Depending on the driving method, the panel design method, etc., the data driving circuit DDIC may be connected to both sides (e.g., upper and lower sides) of the display panel PNL, or may be connected to at least two of the four sides of the display panel PNL.

The gate driving circuit GDIC may be connected to one side (e.g., left or right) of the display panel PNL. Depending on the driving method, the panel design method, etc., the gate driving circuit GDIC may be connected to both sides (e.g., left and right) of the display panel PNL, or may be connected to at least two of the four sides of the display panel PNL.

The controller CTR may be a timing controller used in a conventional display technology or a control device capable of further performing other control functions including the timing controller. Alternatively, the controller CTR may be a control device different from the timing controller, or may be a circuit within the control device. The controller CTR may be implemented with various circuits or electronic components, such as an integrated circuit (IC), a field programmable gate array (FPGA), an application specific integrated circuit (ASIC), or a processor.

The controller CTR may be mounted on a printed circuit board, a flexible printed circuit, or the like, and may be electrically connected to the data driving circuit DDIC and the gate driving circuit GDIC through the printed circuit board or the flexible printed circuit.

The display device 100 according to the present embodiments may be a display including a backlight unit such as a liquid crystal display, or a self-luminous display such as OLED (organic light emitting diode) display, quantum dot display, micro light emitting diode (LED) display, etc.

When the display device 100 according to the present exemplary embodiments is an OLED display, each sub-pixel SP may include an organic light emitting diode (OLED) emitting light as a light emitting device. When the display device 100 according to the present exemplary embodiments is a quantum dot display, each sub-pixel SP may include a light emitting device made of quantum dots, which are semiconductor crystals that emit light. When the display device 100 according to the present embodiments is a micro LED display, each sub-pixel SP emits light by itself and may include a micro LED (Micro Light Emitting Diode) made of an inorganic material as a light emitting device.

Figure 2:
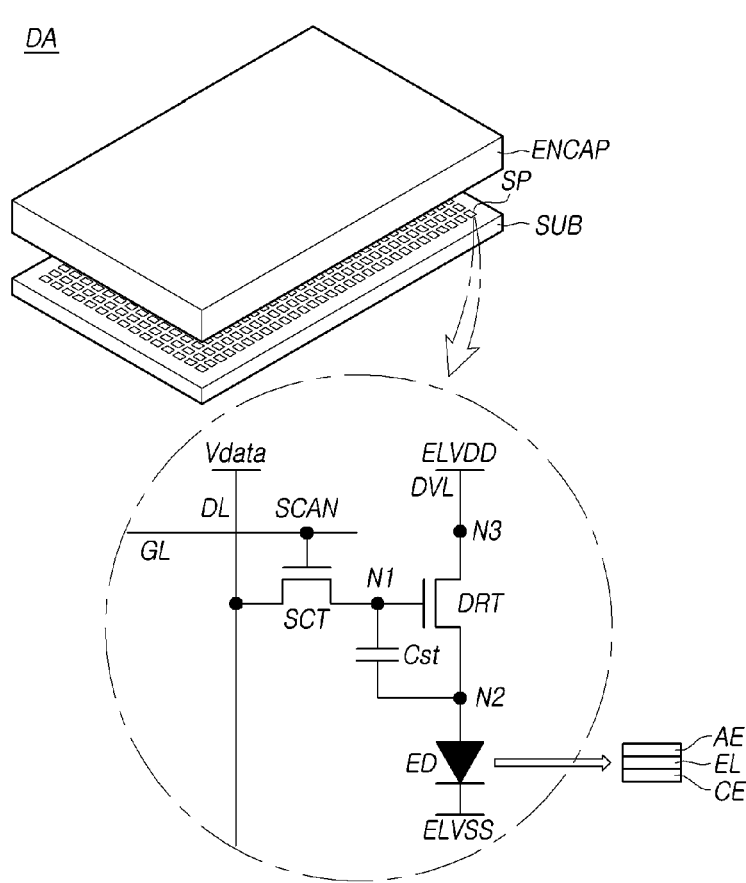
FIG. 2 illustrates a configuration diagram of a display area and a circuit diagram of a sub-pixel of a display device according to an embodiment of the present disclosure.

FIG. 2 is an equivalent circuit of a sub-pixel SP in the display panel PNL according to embodiments of the present disclosure.

Each of the sub-pixels SP included in the display area DA of the display panel PNL may include emitting diode ED, driving transistor DRT for driving emitting diode ED, and scan transistor SCT for transferring data voltage VDATA to first node N1 of driving transistor DRT and a storage capacitor (Cst) for maintaining a constant voltage during one frame, and the like.

The driving transistor DRT may include a first node N1 to which a data voltage may be applied, a second node N2 electrically connected to the emitting diode ED, and a third node N3 to which the driving voltage ELVDD is applied from the driving voltage line DVL. In the driving transistor DRT, the first node N1 may be a gate node, the second node N2 may be a source node or a drain node, and the third node N3 may be a drain node or a source node.

The emitting diode ED may include an anode electrode AE, an emission layer EL, and a cathode electrode CE. The anode electrode AE may be a pixel electrode disposed in each sub-pixel SP, and may be electrically connected to the second node N2 of the driving transistor DRT of each sub-pixel SP. The cathode electrode CE may be a common electrode disposed in common to the plurality of sub-pixels SP, and a ground voltage ELVSS may be applied thereto.

For example, the anode electrode AE may be a pixel electrode, and the cathode electrode CE may be a common electrode. Conversely, the anode electrode AE may be a common electrode, and the cathode electrode CE may be a pixel electrode. Hereinafter, for convenience of description, it is assumed that the anode electrode AE is a pixel electrode and the cathode electrode CE is a common electrode.

For example, the emitting diode ED may be an organic light emitting diode (OLED), an inorganic light emitting diode, or a quantum dot light emitting device. In this case, when the emitting diode ED is an organic light emitting diode, the emission layer EL of the emitting diode ED may include an organic light emitting layer including an organic material.

The scan transistor SCT is turned on/off by a scan signal SCAN that is a gate signal applied through the gate line GL, and it may be electrically connected between the first node N1 of the driving transistor DRT and the data line DL.

The storage capacitor Cst may be electrically connected between the first node N1 and the second node N2 of the driving transistor DRT.

Each sub-pixel SP may have a 2T (Transistor) IC (Capacitor) structure including two transistors DRT and SCT and one capacitor Cst as shown in FIG. 2. In some cases, it may further include one or more transistors or further include one or more capacitors.

The storage capacitor Cst may not be a parasitic capacitor (eg, Cgs or Cgd) that is an internal capacitor that may exist between the first node N1 and the second node N2 of the driving transistor DRT, but may be an external capacitor intentionally designed outside the driving transistor DRT.

Each of the driving transistor DRT and the scan transistor SCT may be an n-type transistor or a p-type transistor.

Since the circuit elements (in particular, the emitting diode ED) in each sub-pixel SP are vulnerable to external moisture or oxygen, an encapsulation layer ENCAP for preventing external moisture or oxygen from penetrating into the circuit elements (particularly, the emitting diode ED) may be disposed on the display panel PNL. The encapsulation layer ENCAP may be disposed to cover the emitting diodes ED.

Figure 3:
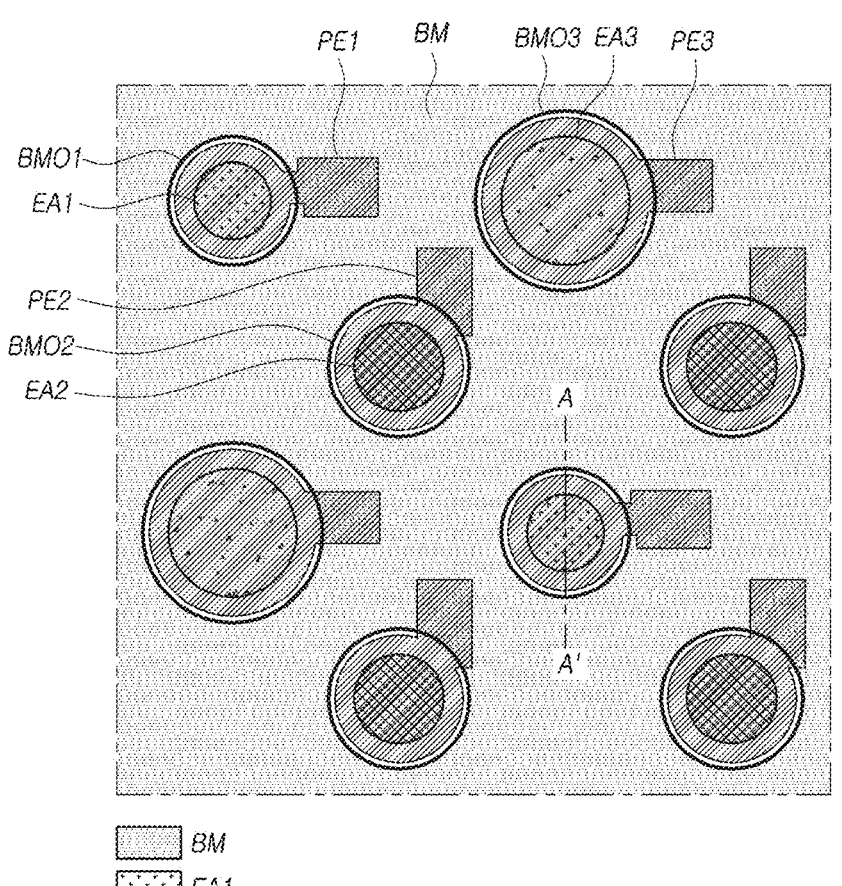
FIG. 3 is a top view of a display device according to a comparative example of the present disclosure.

FIG. 3 is a top view of a display device according to a comparative example of the present disclosure.

Referring to FIG. 3, the display device according to the comparative example includes a first pixel electrode PE1, a second pixel electrode PE2, a third pixel electrode PE3, a first light emitting area EA1, and a second light emitting area EA2, a third light emitting area EA3, and a black matrix BM.

The black matrix BM includes a first opening BMO1, a second opening BMO2, and a third opening BMO3. The first opening BMO1 corresponds to the first light emitting area EA1, the second opening BMO2 corresponds to the second light emitting area EA2, and the third opening BMO3 corresponds to the third light emitting area EA3.

Each of the openings BMO1, BMO2, and BMO3 may be formed to be wider than the light emitting areas EA1, EA2, and EA3 and are spaced apart from each of the respective light emitting areas EA1, EA2, and EA3 by a predetermined distance. Each of the pixel electrodes PE1, PE2, and PE3 may be formed to be wider than the light emitting areas EA1, EA2, and EA3 apart from each of the light emitting areas EA1, EA2, and EA3 by a predetermined distance.

The areas occupied by the first light emitting area EA1, the second light emitting area EA2, and the third light emitting area EA3 in the display area may increase in the order of the first light emitting area EA1, the second light emitting area EA2, and the third light emitting area EA3. When the areas of the light emitting areas EA1, EA2, and EA3 are different as described above, light reflected from the display device may be biased toward one color on the color coordinate.

For example, the first light emitting area EA1 may be a red light emitting area, the second light emitting area EA2 may be a green light emitting area, and the third light emitting area EA3 may be a blue light emitting area. In this example, when the area of the first light emitting area EA1 is the smallest light emitting area, the light reflected from the first light emitting area EA1 is less than the light reflected from the second light emitting area EA2 and the third light emitting area EA3. Accordingly, light reflected from the display device according to the comparative example may be biased toward the complementary color of the first light emitting area EA1 on the color coordinate.

Figure 4:
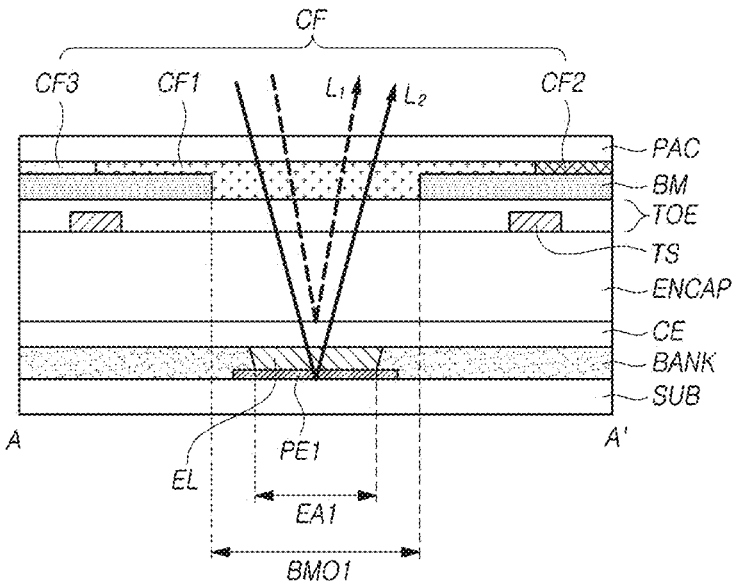
FIG. 4 is a cross-sectional view taken along line A-A' of FIG. 3.

FIG. 4 is a cross-sectional view taken along line A-A' of FIG. 3.

Referring to FIG. 4, the display device according to the comparative example includes a substrate SUB, a first pixel electrode PE1, a bank BANK, a cathode electrode CE, an encapsulation layer ENCAP, and a touch electrode TS, a touch electrode layer on the encapsulation layer TOE, a black matrix BM, a color filter CF, and an adhesive layer PAC.

The light emitting area EA1 may be defined by a bank BANK. The first light emitting area EA1 may be an area in which the first pixel electrode PE1 is located and the bank BANK is open.

The light reflected from the display device may include light L1 reflected from the cathode electrode CE and light L2 reflected from the first pixel electrode PE1. The light L1 and L2 are reflected and pass through the color filter CF including the first color filter pattern CF1, the second color filter pattern CF2, and the third color filter pattern CF3. The color of the light reflected from the first light emitting area EA1 is shifted to a specific color coordinate by the first color filter pattern CF1 while passing through the first color filter pattern CF1. The color shift of the reflected light occurs not only in the first light emitting area EA1, but also in the second light emitting area EA2 and the third light emitting area EA3.

Figure 5:
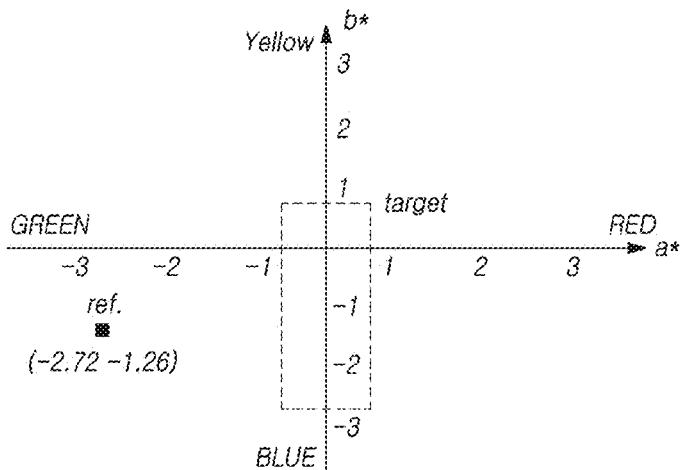
FIG. 5 is a result of measuring color coordinates of light reflected from a display device according to a comparative example of the present disclosure.

FIG. 5 is a measurement of color coordinates of light reflected from a display device according to a comparative example.

Referring to FIG. 5, the color coordinate (ref.) of the reflected light in the comparative example was excessively biased toward green, and as a result, it greatly deviated from the target that may be required in the technical field of the present disclosure. The reason why the light reflected from the display device according to the comparative example is biased toward green is because the amount of reflected light passing through the first color filter pattern CF1, which is red, is small because the area of the first light-emitting area, which is the red light-emitting area, is small.

Figure 6:
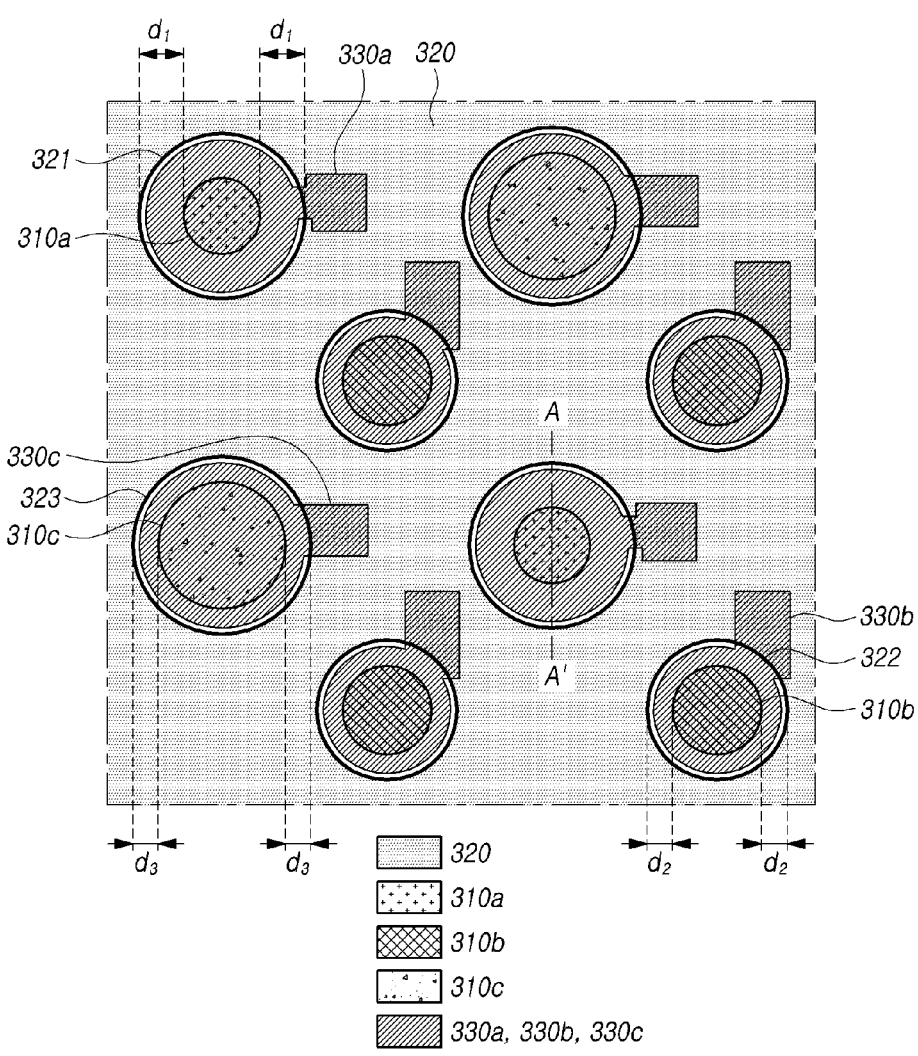
FIG. 6 is a top view of a display device according to an embodiment.

FIG. 6 is a top view of a display device according to embodiments of the present disclosure.

Referring to FIG. 6, the display device according to embodiments includes a first pixel electrode 330a, a second pixel electrode 330b, a third pixel electrode 330c, a first light emitting area 310a, and a second pixel electrode 330a, a second light emitting area 310b, and a third light emitting area 310c, and a black matrix 320.

The display device may include a plurality of sub-pixels. The first sub-pixel may include a first light emitting area 310a, the second sub-pixel may include a second light emitting area 310b, and the third sub-pixel may include a third light emitting area 310c. In the present disclosure, the first sub-pixel, the second sub-pixel, and the third sub-pixel refer to the light emitting element of the sub-pixel and circuit elements driving the light emitting element of the sub-pixel, or a region in which the light emitting element and the circuit element are located.

The first light emitting area 310a is an area emitting light of a predetermined color, and may be an area in which the first pixel electrode 330a is located and the bank BANK is opened. Since the first sub-pixel includes the first light emitting area 310a, the first sub-pixel may display a specific color.

The second light emitting area 310b may emit light of a different color from that of the first light emitting area 310a and may be a different light emitting area from the first light emitting area 310a. Since the second sub-pixel includes the second light emitting area 310b, the second sub-pixel may display a different color from that of the first sub-pixel.

The third light emitting area 310c emits light of a color different from that of the first light emitting area 310a and the second light emitting area 310b, and it may be a different light emitting area from the first light emitting area 310a and the second light emitting area 310b. Since the third sub-pixel includes the third light emitting area 310c, the third sub-pixel may display a different color from the first sub-pixel and the second sub-pixel.

For example, the first sub-pixel may be a red sub-pixel displaying a red color, the second sub-pixel may be a green sub-pixel displaying a green color, and the third sub-pixel may be a blue sub-pixel displaying a blue color.

The area of the first light emitting area 310a may be smaller than the area of the second light emitting area 310b. For example, the light emitting device positioned in the first light emitting area 310a may be a light emitting device having a longer lifetime than the light emitting device positioned in the second light emitting area 310b. Therefore, if the area of the second light emitting area 310b using a light emitting device having a relatively short lifetime is larger than that of the first light emitting area 310a, and the first light emitting area 310a using a light emitting device having a relatively excellent lifespan is smaller than the area of the second light emitting area 310b, the color characteristics of the display device according to usage time can be maintained uniformly for a long time.

The area of the first light emitting area 310a may be smaller than the area of the third light emitting area 310c. For example, the light emitting device positioned in the first light emitting area 310a may be a light emitting device having a longer lifespan than the light emitting device positioned in the third light emitting area 310c. Therefore, if the area of the third light emitting area 310c using a light emitting device having a relatively short lifetime is larger than that of the first light emitting area 310a, and the first light emitting area 310*a* using a light emitting device having a relatively excellent lifespan is smaller than the area of the third light emitting area 310*c*, the color characteristics of the display device according to usage time can be maintained uniformly for a long time.

For example, the first light emitting area 310*a* is a red light emitting area emitting red light, the second light emitting area 310*b* is a green light emitting area emitting green light, and the third light emitting area 310*c* may be a blue light emitting area emitting blue light.

The black matrix may include a first opening 321, a second opening 322, and a third opening 323.

The first opening 321 corresponds to the first sub-pixel, and may be positioned in the first sub-pixel or positioned so that light emitted from the first light-emitting region 310*a* can be directed to the outside of the display device.

The second opening 322 corresponds to the second sub-pixel and may be positioned so that light emitted from the second light emitting area 310*b* can be directed to the outside of the display device.

The third opening 323 corresponds to the third sub-pixel and may be positioned so that light emitted from the third light emitting area 310*c* can be directed to the outside of the display device.

The difference between the area of the first opening 321 and the area of the first light emitting area 310*a* may be greater than the difference between the area of the second opening 322 and the area of the second light emitting area 310*b*. The first opening 321 may be spaced apart from the first light emitting area 310*a* by d1. The second opening 322 may be spaced apart from the second light emitting area 310*b* by d2. A distance d1 between the first opening 321 and the first light emitting area 310*a* may be greater than a distance d2 between the second opening 322 and the second light emitting area 310*b*. That is, the distance d1 between the first opening 321 and the first light emitting area 310*a* may be greater than the distance d2 between the second opening 322 and the second light emitting area 310*b*.

If the difference between the area of the first opening 321 and the area of the first light emitting area 310*a* is greater than the difference between the area of the second opening 322 and the area of the second light emitting area 310*b*, it is possible to prevent or at least reduce the color coordinates of light reflected from the display device from being biased toward one color. For example, as in the comparative example shown in FIG. 3, when the area of the first light emitting area is smaller than the area of the second light emitting area, light reflected from the display device may be biased toward a color complementary to the color of the first light emitting area. However, when the difference between the area of the first opening 321 and the area of the first light emitting area 310*a* is greater than the difference between the area of the second opening 322 and the area of the second light emitting area 310*b* as in the embodiment of the present disclosure, it is possible to prevent or at least reduce light reflected from the display device from being biased toward a color complementary to the color of the first light emitting area 310*a*.

The difference between the area of the first opening 321 and the area of the first light emitting area 310*a* may be greater than the difference between the area of the third opening 323 and the area of the third light emitting area 310*c*. The first opening 321 may be spaced apart from the first light emitting area 310*a* by d1. The third opening 323 may be positioned d3 apart from the third light emitting area 310*c*. A distance d1 between the first opening 321 and the first light emitting area 310*a* may be greater than a distance d3 between the third opening 323 and the third light emitting area 310*c*. That is, the distance d1 between the first opening 321 and the first light emitting area 310*a* may be greater than the distance d3 between the third opening 323 and the third light emitting area 310*c*.

The first pixel electrode 330*a* may be included in the first sub-pixel, the second pixel electrode 330*b* may be included in the second sub-pixel, and the third pixel electrode 330*c* may be included in the third sub-pixel.

The difference between the area of the first pixel electrode 330*a* and the area of the first light emitting area 310*a* may be greater than the difference between the area of the second pixel electrode 330*b* and the area of the second light emitting area 310*b*. For example, if the area of the first light emitting area 310*a* is smaller than the area of the second light emitting area 310*b* and the difference between the area of the first pixel electrode 330*a* and the area of the first light emitting area 310*a* is greater than the difference between the area of the second pixel electrode 330*b* and the area of the second light emitting area 310*b*, it is possible to prevent or at least reduce the color of the light reflected from the display device from being biased toward a color complementary to the color of the light emitted from the first light emitting area 310*a*.

The difference between the area of the first pixel electrode 330*a* and the area of the first light emitting area 310*a* may be greater than the difference between the area of the third pixel electrode 330*c* and the area of the third light emitting area 310*c*. For example, if the area of the first light emitting area 310*a* is smaller than the area of the third light emitting area 310*b* and the difference between the area of the first pixel electrode 330*a* and the area of the first light emitting area 310*a* is greater than the difference between the area of the third pixel electrode 330*b* and the area of the third light emitting area 310*b*, it is possible to prevent or at least reduce the color of the light reflected from the display device from being biased toward a color complementary to the color of the light emitted from the first light emitting area 310*a*.

Figure 7:
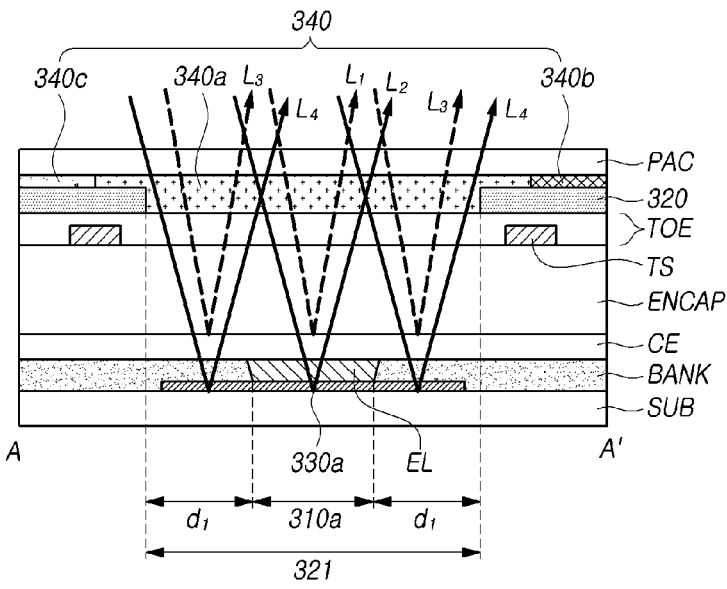
FIG. 7 is a cross-sectional view taken along line A-A' of FIG. 6 according to an embodiment.

FIG. 7 is a cross-sectional view taken along line A-A' of FIG. 6 according to one embodiment.

Referring to FIG. 7, the display device includes a substrate SUB, a first pixel electrode 330*a*, a bank BANK, a cathode electrode CE, an encapsulation layer ENCAP, a touch electrode TS, touch electrode layer on an enacapsulation layer (TOE), a black matrix 320, a color filter 340, and an adhesive layer PAC.

The color filter 340 may be positioned on the encapsulation layer ENCAP, and the black matrix 320 may be positioned on the encapsulation layer ENCAP. The color filter 340 may include a first color filter pattern 340*a*, a second color filter pattern 340*b*, and a third color filter pattern 340*c*.

For example, the black matrix 320 may be positioned on the encapsulation layer ENCAP, and the color filter 340 may be positioned on the black matrix 320. The black matrix 320 may be positioned at a boundary between the first color filter pattern 340*a*, the second color filter pattern 340*b*, and the third color filter pattern 340*c*. When the color filter 340 and the black matrix 320 are included on the encapsulation layer ENCAP, the display device may have low reflectance with respect to external light even if it does not include a polarizer.

The color filter 340 includes the first color filter pattern 340*a* corresponding to the first light emitting area 310*a* (e.g., overlapping), the second color filter pattern 340*b* corresponding to the second light emitting area (e.g., overlapping), and the third color filter pattern 340*c* corresponding to the third light emitting area (e.g., overlapping).

The fact that the first color filter pattern 340a corresponds to the first light emitting area 310a means that light emitted from the first light emitting area 310a is positioned to pass through the first color filter pattern 340a and the first color filter pattern 340a has the same color as the light emitted from the first light emitting area 310a.

The fact that the second color filter pattern 340b corresponds to the second light emitting area 310b means that light emitted from the second light emitting area 310b is positioned to pass through the second color filter pattern 340b and the second color filter pattern 340b has the same color as the light emitted from the second light emitting area 310b.

The fact that the third color filter pattern 340c corresponds to the third light emitting area 310c means that light emitted from the third light emitting area 310c is positioned to pass through the third color filter pattern 340c and the third color filter pattern 340c has the same color as the light emitted from the third light emitting area 310c.

The light reflected from the display device may include light L1 and L2 reflected from the first light emitting area 310a and light L3 and L4 reflected from the periphery of the first light emitting area 310a.

The light L1 and L2 reflected from the first light emitting area 310a may include the light L1 reflected from the cathode electrode CE and the light L2 reflected from the first pixel electrode 330a.

The light L3 and L4 reflected from the periphery of the first light emitting area 310a may include the light L3 reflected from the cathode electrode CE and the light L4 reflected from the first pixel electrode 330a.

The reflected lights L1, L2, L3, and L4 may all have a specific color by the first color filter pattern 340a while passing through the first color filter pattern 340a.

In the display devices according to the embodiment shown in FIG. 7, unlike the comparative example shown in FIG. 4, the first opening 321 is spaced apart from the light emitting area 310a by a distance d1. Lights L3 and L4 reflected from the peripheral portion of the light emitting area 310a as well as lights L1 and L2 reflected from the light emitting area 310a pass through the first color filter pattern 340a to have a specific color. As a result, according to embodiments of the present disclosure, it is possible to easily adjust the color reflected from the display device so as not to be excessively biased toward one color.

Figure 8:
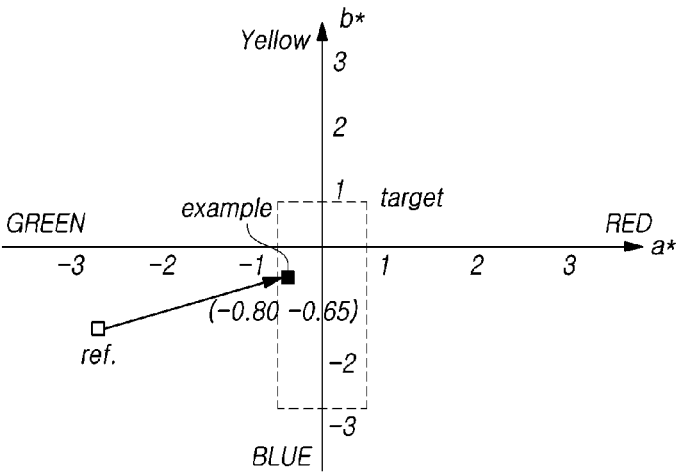
FIG. 8 is a result of measuring color coordinates of light reflected from a display device according to an embodiment of the present disclosure.

FIG. 8 is a result of measuring color coordinates of light reflected from a display device according to embodiments of the present disclosure.

When compared with the color coordinate of the light reflected from the display device according to the comparative example (ref.) shown in FIG. 5, the color coordinate of the light reflected from the display device according to the embodiments of the present disclosure (example) has a more neutral color.

Figure 9:
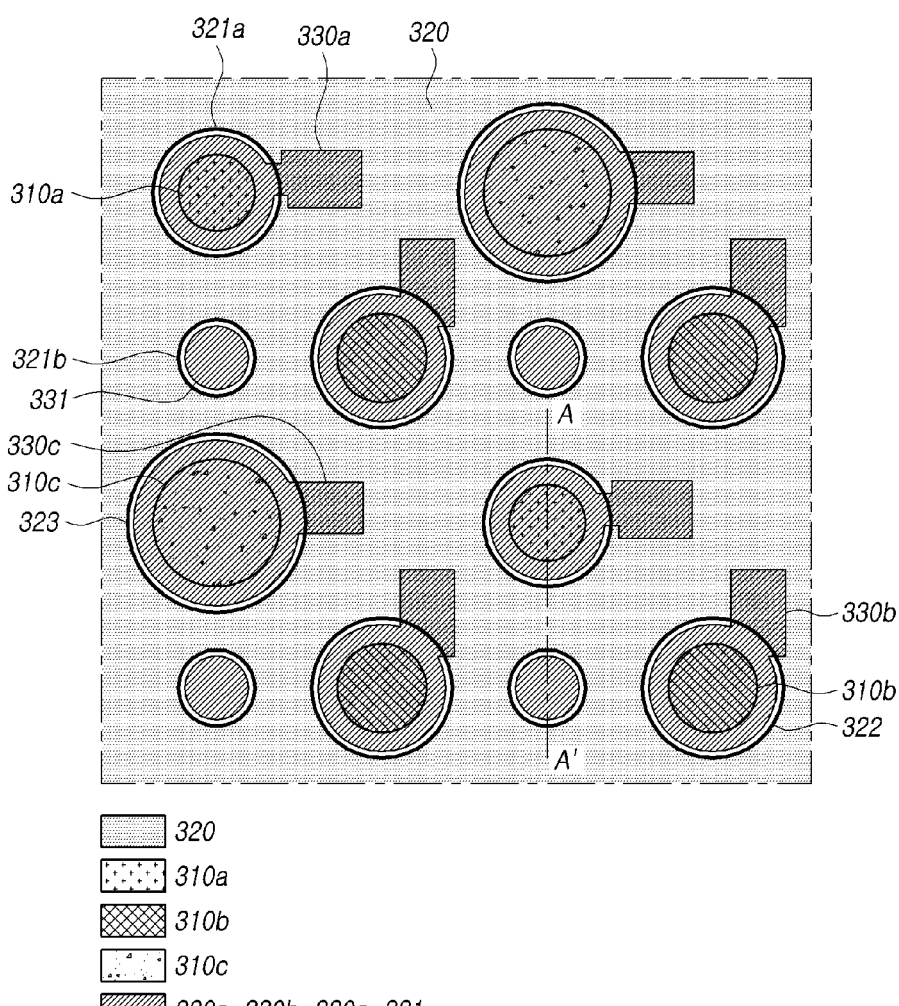
FIG. 9 is a top view of a display device according to an embodiment.

FIG. 9 is a top view of a display device according to embodiments of the present disclosure.

Referring to FIG. 9, the display device according to the embodiments include a first pixel electrode 330a, a second pixel electrode 330b, a third pixel electrode 330c, a reflective electrode 331 (e.g., an auxiliary electrode), a first light emitting area 310a, a second light emitting area 310b, a third light emitting area 310c, and a black matrix 320.

The black matrix 320 may include a first opening corresponding to the first sub-pixel, and the first opening may include a main portion 321a and an auxiliary portion 321b. The main portion 321a of the first opening may be positioned in the first light emitting area 310a of the first sub-pixel. The auxiliary portion 321b of the first opening may be positioned in the non-light emitting area of the first sub-pixel.

The reflective electrode 331 may correspond to the auxiliary portion 321b of the black matrix 320. The fact that the reflective electrode 331 corresponds to the auxiliary portion 321b of the first opening of the black matrix 320 means that the reflective electrode 331 is positioned to reflect the light passing through the auxiliary portion 321b of the first opening.

When the display device includes the auxiliary portion 321b and the reflective electrode 331 as described above, the color of light reflected from the reflective electrode 331 passing through the auxiliary portion 321b is shifted by the first color filter pattern. Accordingly, it is possible to prevent or at least reduce the color of light reflected from the display device from being biased toward one color.

Figure 10:
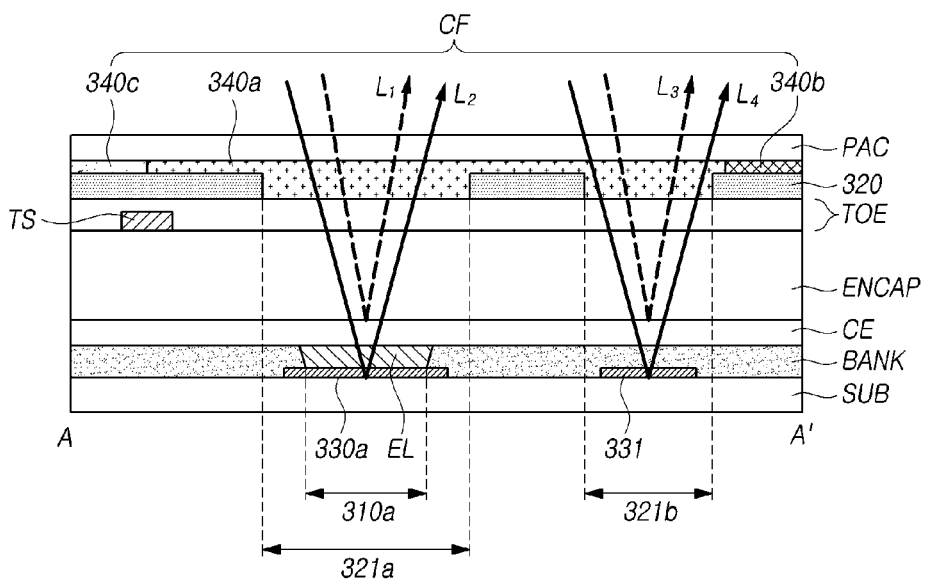
FIG. 10 is a cross-sectional view taken along line A-A' of FIG. 9 according to an embodiment.

FIG. 10 is a cross-sectional view taken along line A-A' of FIG. 9 according to an embodiment.

Referring to FIG. 10, the light reflected from the display device may include light L1 and L2 reflected from the first light emitting area 310a through the main portion 321a of the first opening, and light L3 and L4 reflected in the non-light emitting area through the auxiliary portion 321b of the first opening.

Light L1 and L2 reflected from the light emitting area 310a passing through the main portion 321a of the first opening may include the light L1 reflected from the cathode electrode CE and the light L2 reflected from the first pixel electrode 330a.

The light L3 and L4 reflected in the non-light emitting area passing through the auxiliary portion 321b of the first opening is the light L3 reflected from the cathode electrode CE and the light reflected from the reflective electrode 331 (L4) may be included.

The reflective electrode 331 may be the same material layer as the first pixel electrode 330a. When the reflective electrode 331 is the same material layer as the first pixel electrode 330a, it means that the reflective electrode 331 is positioned on the same layer as the layer on which the first pixel electrode 330a is positioned, or the first pixel electrode 330a is positioned on the same layer. It may mean that the layer is formed of the same material as the pixel electrode 330a.

Even if the area of the first light emitting area 310a is smaller than the area of the second light emitting area and the third light emitting area, light reflected from the display device may not be excessively shifted to any one color. This is because the display device includes the auxiliary portion 321b and the reflective electrode 331, and light L3 and L4 reflected through the auxiliary portion 321b in the non-light emitting area exists. While the description of FIGS. 9 and 10 are described with respect to having an auxiliary portion and a reflective electrode for the first sub-pixel, the second sub-pixel and the third sub-pixel may also have their own respective auxiliary portions and reflective electrodes in the non-light emitting areas of the second sub-pixel and the third sub-pixel to prevent or at least reduce the light reflected from the display device from being excessively biased toward one color.

The region in which the auxiliary portion 321b is located may be a region in which the light emitting device is not located. Accordingly, the emission layer EL may not be located in the region where the auxiliary portion 321b is located.

Figure 11:
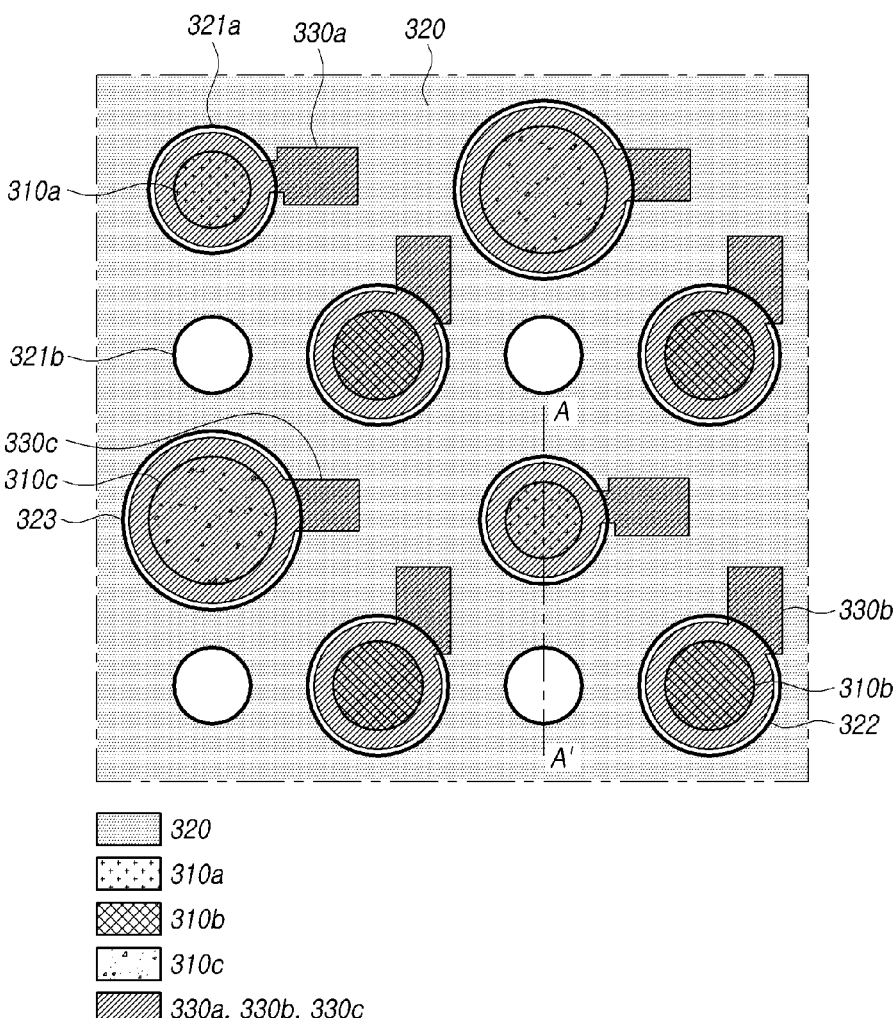
FIG. 11 is a plan view of a display device according to an embodiment.

FIG. 11 is a plan view of a display device according to embodiments of the present disclosure.

Referring to FIG. 11, the display device according to the embodiments may include a first pixel electrode 330a, a second pixel electrode 330b, a third pixel electrode 330c, a first light emitting area 310a, and a first pixel electrode 330a, a second light emitting area 310b, a third light emitting area 310c, and a black matrix 320.

The black matrix 320 may include a first opening corresponding to the first sub-pixel, and the first opening may include a main portion 321a and an auxiliary portion 321b. The main portion 321a of the first opening may be positioned in the first light emitting area 310a while being positioned in the first sub-pixel. The auxiliary portion 321b of the first opening may be positioned in the first sub-pixel and positioned in the non-light emitting area of the first sub-pixel.

When the display device includes the auxiliary portion 321b, the color of the light reflected from the cathode through the auxiliary portion 321b may be shifted by the first color filter pattern. Accordingly, even if the area of the first light emitting area 310a is small, it is possible to prevent or at least reduce the light reflected from the display device from shifting to a specific color.

Figure 12:
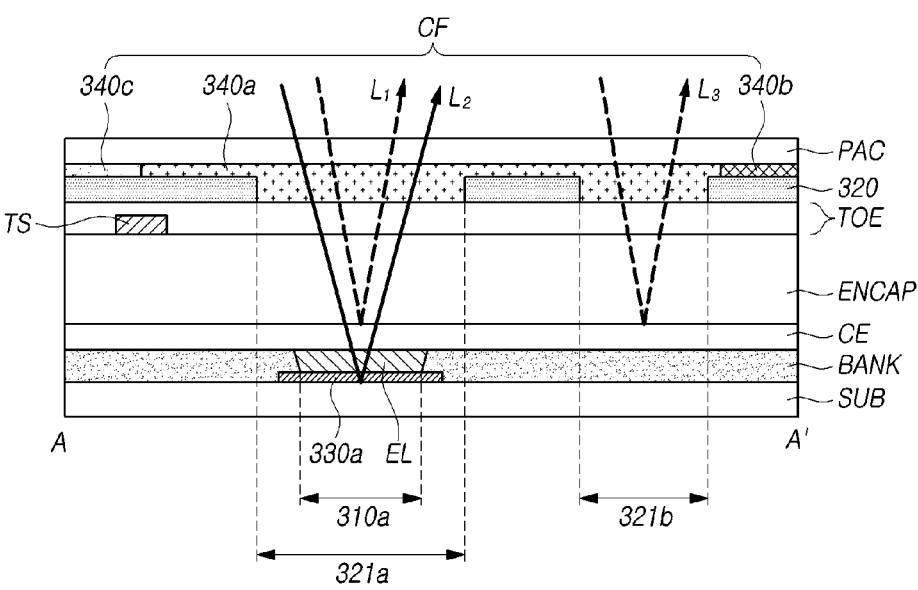
FIG. 12 is a cross-sectional view taken along line A-A' of FIG. 11 according to an embodiment.

FIG. 12 is a cross-sectional view taken along line A-A' of FIG. 11 according to an embodiment.

Referring to FIG. 12, the light reflected from the display device may include light L1 and L2 reflected from the first light emitting area 310a through the main portion 321a of the first opening, and light L3 passing through the auxiliary portion 321b of the first opening and reflected in the non-light emitting area.

Light L1 and L2 reflected from the light emitting area 310a through the main portion 321a of the first opening include light L1 reflected from the cathode electrode CE and light L2 reflected from the first pixel electrode 330a.

The light L3 reflected from the non-light emitting area through the auxiliary portion 321b of the first opening may include the light L3 reflected from the cathode electrode CE.

Even if the area of the first light emitting area 310a is smaller than the area of the second light emitting area and the third light emitting area, light reflected from the display device may not be excessively shifted to any one color. This is because the display device includes the auxiliary portion 321b, and light L3 reflected through the auxiliary portion 321b in the non-light emitting area exists.

While the description of FIGS. 11 and 12 are described with respect to having an auxiliary portion for the first sub-pixel, the second sub-pixel and the third sub-pixel may also have their own respective auxiliary portions in the non-light emitting areas of the second sub-pixel and the third sub-pixel to prevent or at least reduce the light reflected from the display device from being excessively biased toward one color.

A brief description of the embodiments of the present disclosure described above is as follows.

According to embodiments of the present disclosure may provide a display device 100 including a first sub-pixel, a second sub-pixel, a color filter 340, and a black matrix 320 may be provided.

The first sub-pixel may include a first light emitting area 310a.

The second sub-pixel may include a second light emitting area 310b emitting light having a different color from that of the first light emitting area 310a.

The color filter 340 may include a first color filter pattern 340a and a second color filter pattern 340b. The first color filter pattern 340a may correspond to the first light emitting area 310a, and the second color filter pattern 340b may correspond to the second light emitting area 310b.

The black matrix 320 may include a first opening 321 and a second opening 322. The first opening 321 may correspond to the first sub-pixel, and the second opening 322 may correspond to the second sub-pixel.

A difference between an area of the first opening 321 and an area of the first light emitting area 310a may be greater than a difference between an area of the second opening 322 and an area of the second light emitting area 310b.

An area of the first light emitting area 310a may be smaller than the area of the second light emitting area 310b.

The display device 100 may include an encapsulation layer ENCAP, the color filter 340 may be disposed on the encapsulation layer ENCAP, and the black matrix BM may be disposed on the encapsulation layer ENCAP.

The display device 100 may include a third sub-pixel including a third light emitting area 310c. The third light emitting area 310c may emit light of a different color from that of the first light emitting area 310a and the second light emitting area 310b.

The color filter 340 may include a third color filter pattern 340c corresponding to the third light emitting area 310c. The black matrix may include a third opening 323 corresponding to the third sub-pixel. A difference between an area of the first opening 321 and an area of the first light emitting area 310a may be greater than a difference between an area of the third opening 323 and an area of the third light emitting area 310c.

An area of the first light emitting area 310a may be smaller than an area of the third light emitting area 310c.

The first sub-pixel may be a red sub-pixel, the second sub-pixel may be a green sub-pixel, and the third sub-pixel may be a blue sub-pixel.

The first opening 321 may correspond to the first light emitting area 310a. In the first opening 321, a distance d1 between the first opening 321 and the first light emitting area 310a may be greater than a distance d2 between the second opening 322 and the second light emitting area 310b.

The first sub-pixel includes a first pixel electrode 330a, the second sub-pixel includes a second pixel electrode 330b, and a difference between the area of the first pixel electrode 330a and the first light emitting area 310a may be greater than the difference between the area of the second pixel electrode 330b and the area of the second light emitting area 310b.

The display device 100 may include a non-light emitting area. The first opening 321 may include a main portion 321a corresponding to the first light emitting area 310a and an auxiliary portion 321b corresponding to the non-light emitting area.

The display device 100 may include a reflective electrode 331 corresponding to the auxiliary portion 321b.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A display device comprising:
a first sub-pixel comprising a first light emitting area configured to emit light of a first color and a first non-light emitting area that does not emit light;
a color filter comprising a first color filter pattern that overlaps both the first light emitting area and the first non-light emitting area of the first sub-pixel; and
a black matrix comprising a first portion, a second portion, and a third portion, a first opening formed between the first portion of the black matrix and the second portion of the black matrix, a second opening smaller than the first opening formed between the second portion of the black matrix and the third portion of the black matrix, the second portion of the black matrix being between the first opening and the second opening, the first opening overlapping the first light emitting area, and the second opening overlapping the first non-light emitting area.

2. The display device of claim 1, wherein the first light emitting area of the first sub-pixel comprises a first pixel electrode, a first emission layer on the first pixel electrode, and a first portion of a cathode electrode on the first emission layer, and the first non-light emitting area of the first sub-pixel comprises a first auxiliary electrode and a second portion of the cathode electrode on the first auxiliary electrode but lacks any emission layer.

3. The display device of claim 2, wherein the first pixel electrode and the first auxiliary electrode are made of a same material.

4. The display device of claim 2, wherein the first pixel electrode and the first auxiliary electrode are reflective.

5. The display device of claim 2, wherein the first pixel electrode and the first auxiliary electrode are formed on a same layer.

6. The display device of claim 2, further comprising:
a bank including an opening that defines the first light emitting area of the first sub-pixel and the first emission layer is in the opening,
wherein a portion of the bank in the first non-light emitting area is disposed between the first auxiliary electrode and the second portion of the cathode electrode without any opening in the bank between the first auxiliary electrode and the second portion of the cathode electrode.

7. The display device of claim 1, wherein the first light emitting area of the first sub-pixel comprises a first pixel electrode, a first emission layer on the first pixel electrode, and a first portion of a cathode electrode on the first emission layer, and the first non-light emitting area of the first sub-pixel comprises a second portion of the cathode electrode and lacks any emission layer and pixel electrode.

8. The display device of claim 7, further comprising:
a bank including an opening that defines the first light emitting area of the first sub-pixel and the first emission layer is in the opening, wherein a portion of the bank in the first non-light emitting area is disposed between a first auxiliary electrode and the second portion of the cathode electrode without any opening in the bank between the first auxiliary electrode and the second portion of the cathode electrode.

9. The display device of claim 1, further comprising:
a second sub-pixel comprising a second light emitting area configured to emit light of a second color that is different from the first color and a second non-light emitting area that does not emit light;
a third sub-pixel comprising a third light emitting area configured to emit light of a third color that is different from the first color and the second color and a third non-light emitting area that does not emit light,
wherein an area of the first light emitting area is smaller than an area of the second light emitting area and an area of the third light emitting area.

10. The display device of claim 9, wherein the color filter further comprises a second color filter pattern that overlaps both the second light emitting area and the second non-light emitting area of the second sub-pixel, and a third color filter pattern that overlaps both the third light emitting area and the third non-light emitting area of the third sub-pixel,
wherein the black matrix further comprises:
a third opening and a fourth opening that is smaller than the third opening, the third opening overlapping the second light emitting area, and the fourth opening overlapping the second non-light emitting area; and
a fifth opening and a sixth opening that is smaller than the fifth opening, the fifth opening overlapping the third light emitting area, and the sixth opening overlapping the third non-light emitting area.

11. The display device of claim 10, wherein the second light emitting area of the second sub-pixel comprises a second pixel electrode and the second non-light emitting area of the second sub-pixel comprises a second auxiliary electrode, wherein the second pixel electrode and the second auxiliary electrode are reflective,
wherein the third light emitting area of the third sub-pixel comprises a third pixel electrode and the third non-light emitting area of the third sub-pixel comprises a third auxiliary electrode, wherein the third pixel electrode and the third auxiliary electrode are reflective.

12. The display device of claim 10, wherein the second light emitting area of the second sub-pixel comprises a second pixel electrode and the second non-light emitting area of the second sub-pixel comprises a second portion of a cathode electrode but lacks any emission layer and pixel electrode,
wherein the third light emitting area of the third sub-pixel comprises a third pixel electrode and the third non-light emitting area of the third sub-pixel comprises a third portion of the cathode electrode but lacks any emission layer and pixel electrode.

* * * * *